(12) United States Patent
Kazama et al.

(10) Patent No.: US 8,410,610 B2
(45) Date of Patent: Apr. 2, 2013

(54) CONNECTING TERMINALS WITH CONDUCTIVE TERMINAL-FORMING MEMBERS HAVING TERMINAL PORTIONS EXTENDING IN DIFFERENT DIRECTIONS

(75) Inventors: Toshio Kazama, Nagano (JP); Shigeki Ishikawa, Nagano (JP)

(73) Assignee: NHK Spring Co., Ltd., Kanagawa (JP)

( * ) Notice: Subject to any disclaimer, the term of this patent is extended or adjusted under 35 U.S.C. 154(b) by 222 days.

(21) Appl. No.: 12/734,192

(22) PCT Filed: Oct. 16, 2008

(86) PCT No.: PCT/JP2008/068762
§ 371 (c)(1),
(2), (4) Date: Apr. 16, 2010

(87) PCT Pub. No.: WO2009/051183
PCT Pub. Date: Apr. 23, 2009

(65) Prior Publication Data
US 2010/0219536 A1 Sep. 2, 2010

(30) Foreign Application Priority Data
Oct. 19, 2007 (JP) .................................. 2007-273116

(51) Int. Cl.
*H01L 23/48* (2006.01)
(52) U.S. Cl. .. 257/773; 257/734; 257/776; 257/E23.001
(58) Field of Classification Search ........... 257/773–776
See application file for complete search history.

(56) References Cited

U.S. PATENT DOCUMENTS

| 5,259,770 | A | 11/1993 | Bates et al. |
| 7,378,742 | B2 * | 5/2008 | Muthukumar et al. ....... 257/773 |
| 2004/0127073 | A1 | 7/2004 | Ochiai |
| 2005/0099195 | A1 | 5/2005 | Machida et al. |

(Continued)

FOREIGN PATENT DOCUMENTS

| JP | 05-041425 | 2/1993 |
| JP | 08-236911 | 9/1996 |

(Continued)

OTHER PUBLICATIONS

Office Action dated Feb. 15, 2012, issued for the Taiwanese patent application.

(Continued)

*Primary Examiner* — Thanh Nguyen
(74) *Attorney, Agent, or Firm* — Edwards Wildman Palmer LLP; James E. Armstrong, IV; George N. Chaclas

(57) ABSTRACT

A connecting terminal, a semiconductor package, a wiring board, a connector, and a microcontactor that can achieve a stable contact with a contact target are provided. To achieve the object and to establish an electrical connection to a contact target by making a physical contact with the contact target, there are provided a plurality of conductive terminal-forming members each having a terminal portion, which is extended in a band shape and at least a part of a surface of which forms a curved surface. Each terminal portion is configured so that a part of which is laminated on a part of at least one terminal portion in a thickness direction. All the terminal portions may be laminated at respective tip portions in the thickness direction.

23 Claims, 12 Drawing Sheets

U.S. PATENT DOCUMENTS

| | | |
|---|---|---|
| 2005/0208786 A1 | 9/2005 | Dittmann |
| 2005/0223554 A1 | 10/2005 | Ochiai |
| 2006/0035485 A1 | 2/2006 | Jaquette et al. |

FOREIGN PATENT DOCUMENTS

| | | |
|---|---|---|
| JP | 2000-315555 | 11/2000 |
| JP | 2003-217774 | 7/2003 |
| JP | 2004-012357 | 1/2004 |
| JP | 2004-221052 | 8/2004 |
| JP | 2005-140677 | 6/2005 |
| TW | I243245 B | 11/2005 |
| TW | I276258 B | 3/2007 |
| WO | 2004/030080 A1 | 4/2004 |

OTHER PUBLICATIONS

Chinese Office Action dated Apr. 12, 2012.
International Search Report and Written Opinion dated Nov. 18, 2008, issued in International Application No. PCT/JP2008/068762.
Office Action issued in Taiwanese Application No. 097139852; Date Mailed: Feb. 15, 2012.

* cited by examiner

CONNECTING TERMINALS WITH CONDUCTIVE TERMINAL-FORMING MEMBERS HAVING TERMINAL PORTIONS EXTENDING IN DIFFERENT DIRECTIONS

TECHNICAL FIELD

The present invention relates to a connecting terminal, and also relates to a semiconductor package, a wiring board, a connector, and a microcontactor that have the connecting terminal.

BACKGROUND ART

A semiconductor package, such as a BGA (Ball Grid Array) and a CSP (Chip Scale Package), has a plurality of connecting terminals arranged in a predetermined pattern on its surface. The connecting terminals are formed of spherical solders. In general, the solders are fused when the connecting terminals are electrically connected to an electrode pad such as a motherboard (see Patent Document 1 for example).

Patent Document 1: Japanese Laid-open Patent Publication No. 08-236911

DISCLOSURE OF INVENTION

Problem to be Solved by the Invention

However, in the above-mentioned conventional technology, because the coefficient of thermal expansion differs between the semiconductor package and the motherboard, the connecting terminals are sometimes cracked due to a difference in the amount of thermal expansion by heat between these members, resulting in contact failure.

The present invention has been made in view of the above, and it is an object of the present invention to provide a connecting terminal that can achieve stable contact with a contact target, and to provide a semiconductor package, a wiring board, a connector, and a microcontactor having the connecting terminal.

Means for Solving Problem

To solve the problem described above and achieve the object, a connecting terminal according to the present invention to be in contact with a contact target for establishing an electrical connection to the contact target includes: a plurality of conductive terminal-forming members each having a terminal portion, which is extended in a band shape and at least a portion of a surface of which forms a sphere, wherein each terminal portion and at least one of other terminal portions are partly laminated on each other in a thickness direction.

In the connecting terminal according to the present invention as set forth in the invention described above, tip portions of all the terminal portions are laminated one on top of the other in the thickness direction.

In the connecting terminal according to the present invention as set forth in the invention described above, the terminal-forming member having the terminal portion to be in direct contact with the contact target is made of a material different from a material of the other terminal-forming members.

In the connecting terminal according to the present invention as set forth in the invention described above, each terminal portion has a slit cut along a direction in which the terminal portion is extended in the band shape.

In the connecting terminal according to the present invention as set forth in the invention described above, each terminal portion is extended in a different direction from those of the other terminal portions.

In the connecting terminal according to the present invention as set forth in the invention described above, the plurality of terminal-forming members has identical shapes.

In the connecting terminal according to the present invention as set forth in the invention described above, each terminal-forming member includes a base portion that is in a form of a plate and that has an opening portion piercing therethrough in a thickness direction, and each terminal portion is extended in the band shape from an inner periphery of the opening portion.

In the connecting terminal according to the present invention as set forth in the invention described above, each of the plurality of terminal-forming members includes an inner terminal-forming member formed such that an inner surface of a tip portion of each terminal portion forms a part of a substantial sphere; and an outer terminal-forming member laminated on an outer circumferential side of the inner terminal-forming member.

In the connecting terminal according to the present invention as set forth in the invention described above, the inner terminal-forming member is made of a material different from a material of the outer terminal-forming member.

A semiconductor package according to the present invention includes a plurality of the connecting terminals according to the present invention as set forth in the invention described above, wherein the connecting terminals are arranged on a flat surface.

A wiring board according to the present invention includes a plurality of the connecting terminals according to the present invention as set forth in the invention described above, wherein the connecting terminals are arranged on a flat surface.

A connector according to the present invention for establishing an electrical connection between different circuit structures includes: the connecting terminals according to the present invention as set forth in the invention described above, wherein the connecting terminals are arranged equally in number on both sides of a flat surface, and the connecting terminals are protruding in opposite directions with respect to the flat surface and are electrically connected to each other.

A microcontactor according to the present invention includes: the plurality of connecting terminals according to the present invention as set forth in the invention described above; a plurality of wirings that are electrically connected to the plurality of connecting terminals, respectively; and an insulating sheet material for holding the plurality of wirings parallel to one another.

Effect Of The Invention

According to the present invention, a part of each terminal portion included in each of terminal-forming members is laminated on a part of at least one of other terminal portions in a thickness direction. Therefore, even when a position shift for a contact target occurs, the position shift can be absorbed and stable contact with the contact target can be achieved.

Figure 1:
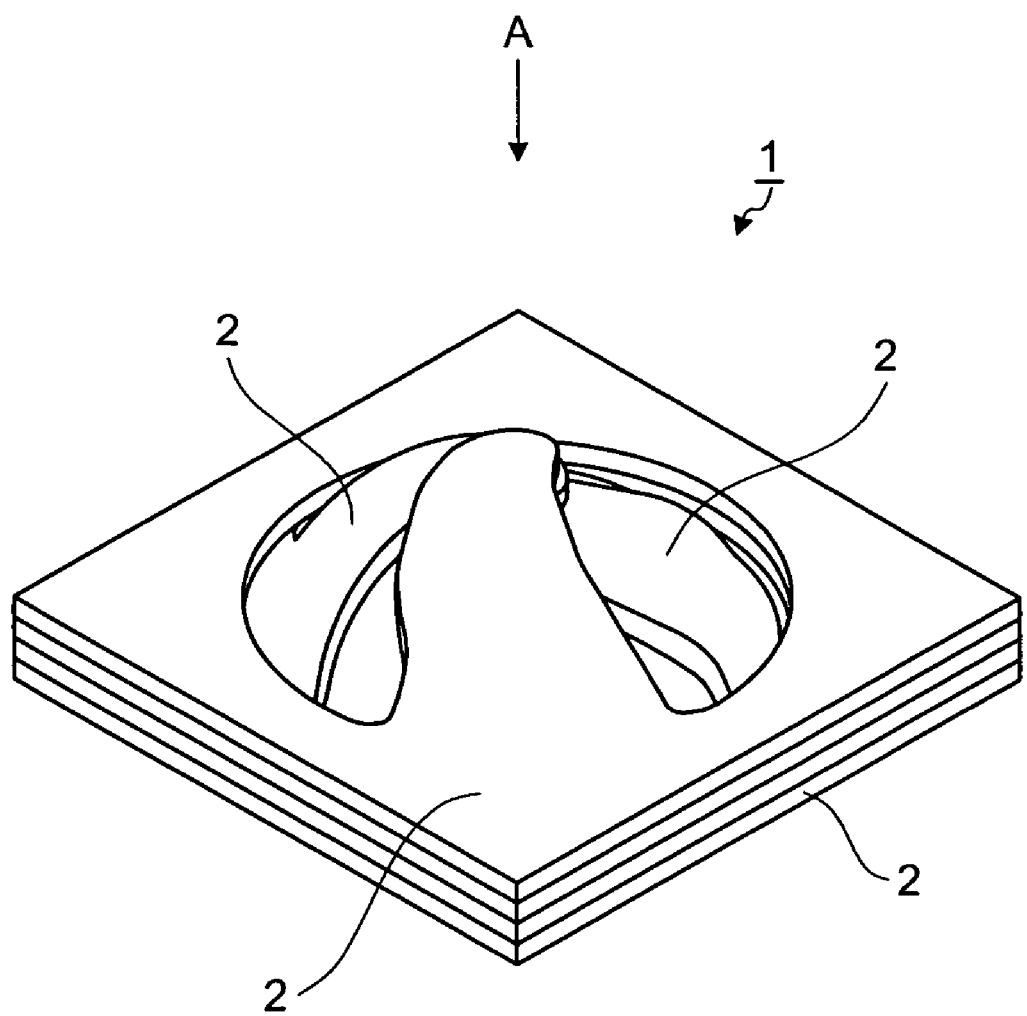
FIG. 1 is a perspective view illustrating a configuration of a connecting terminal according to a first embodiment of the present invention.

EXPLANATIONS OF LETTERS OR NUMERALS 1, 3, 5, 8, 11, 12 Connecting terminal
2, 4a, 4b, 6, 7, 9a, 9b, 12a, 12b Terminal-forming member
11a Inner terminal-forming member
11b Outer terminal-forming member
20, 40a, 40b, 60, 70, 106, 202, 306 Opening portion
21, 41a, 41b, 61, 71, 91a, 91b, 111a, 111b Base portion
22, 42a, 42b, 62, 72, 92a, 92b, 112a, 112b Terminal portion
100, 501 Semiconductor package
101, 301 Substrate
102, 302, 502 Electrode
103, 303 Solder
104, 304 Cover member
105, 201, 305, 402 Resin sheet
113a, 221 Tip portion
200 Connector
300 Wiring board
400 Microcontactor
401 Wiring
500 Contacted object
621 Slit

BEST MODE(S) FOR CARRYING OUT THE INVENTION

Best modes for carrying out the present invention (hereinafter, referred to as "embodiments") are explained below with reference to the accompanying drawings. It should be noted that the drawings are schematic and a relation between the thickness and width of each portion, a ratio of the thicknesses of the respective portions and the like are different from realistic ones. It goes without saying that the drawings depict some portions as having different relations and ratios of dimensions.

(First Embodiment)

Figure 2:
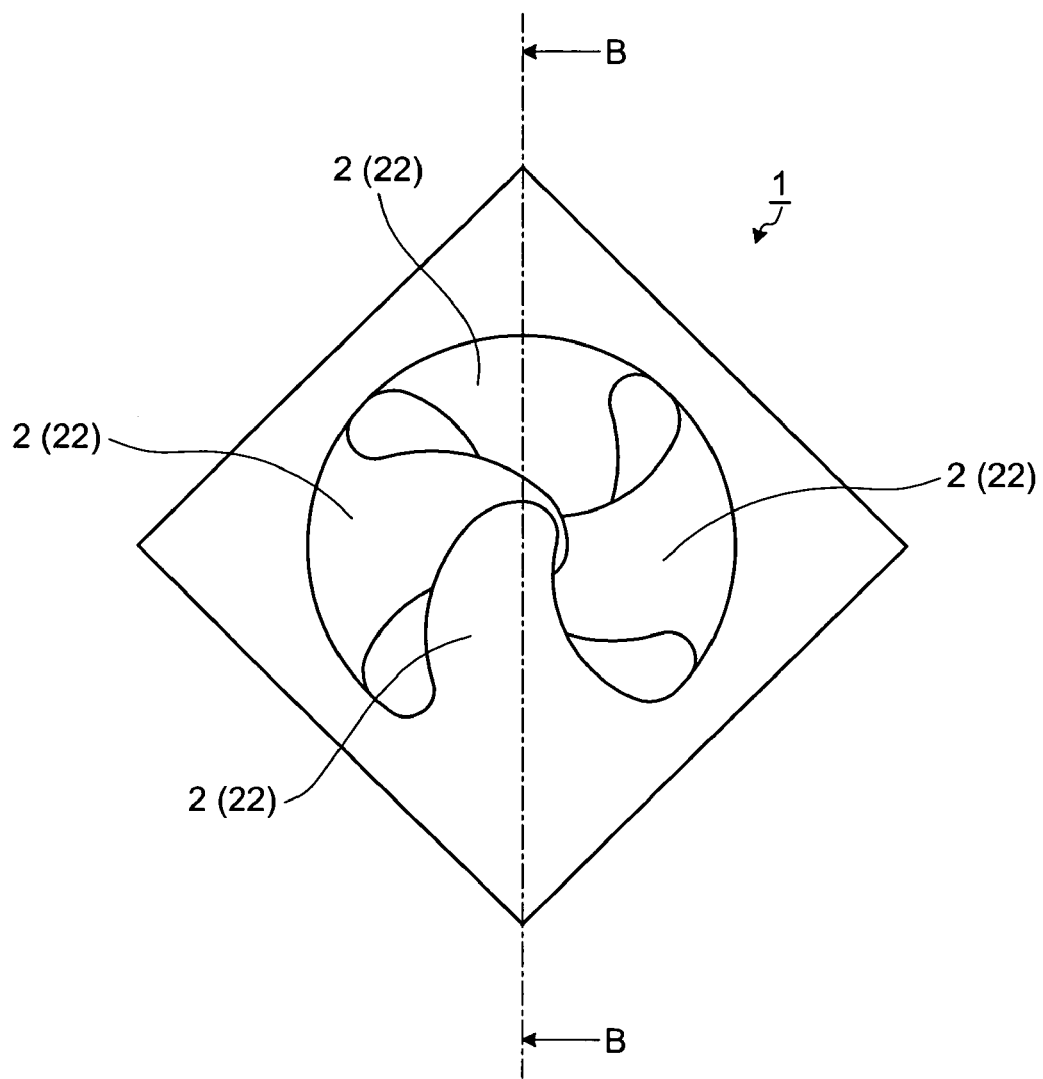
FIG. 2 is a plan view taken in a direction of an arrow A of FIG. 1.
Figure 3:
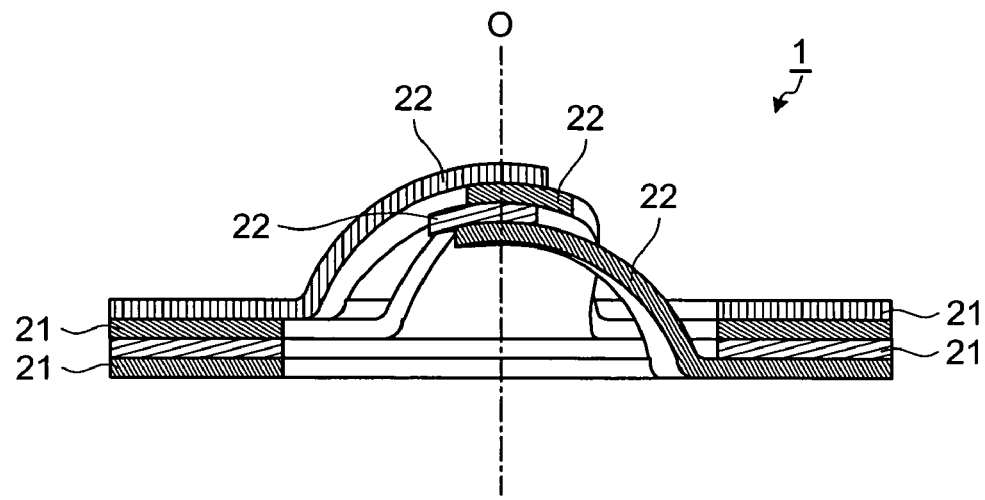
FIG. 3 is a cross sectional view taken along a line B-B of FIG. 2.

FIG. 1 is a perspective view illustrating a configuration of a connecting terminal according to a first embodiment of the present invention. FIG. 2 is a plan view taken in a direction of an arrow A of FIG. 1. FIG. 3 is a cross sectional view taken along a line B-B of FIG. 2. A connecting terminal 1 shown in FIGS. 1 to 3 has a structure in which four conductive terminal-forming members 2 having mutually identical shapes are laminated.

Figure 4:
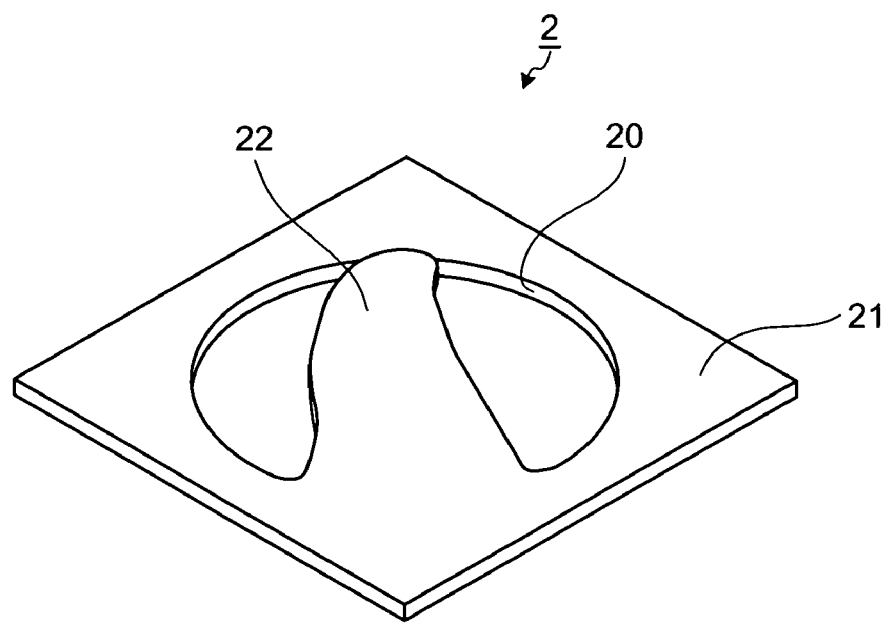
FIG. 4 is a perspective view illustrating a configuration of a terminal-forming member included in the connecting terminal according to the first embodiment of the present invention.

FIG. 4 is a perspective view illustrating a configuration of the terminal-forming member 2. The terminal-forming member 2 shown in the figure includes a flat base portion 21 on which an opening portion 20 having a circular cross section is formed in its center, and a terminal portion 22 extended from an inner periphery of the opening portion 20 of the base portion 21 in a direction different from the surface of the base portion 21. The terminal-forming member 2 is made of a conductive material.

The terminal portion 22 is in the form of a band tapering from a base end to a tip and slightly twisted in a spiral manner. Each of the surfaces of the terminal portion 22, i.e., the outer and inner surfaces forms a part of a sphere.

The terminal-forming member 2 structured as described above is obtained by press molding for example. The terminal-forming member 2 can also be obtained by etching a single plate and then performing press molding or MEMS (Micro Electro Mechanical Systems) molding.

The base portions 21 of the four terminal-forming members 2 that form the connecting terminal 1 completely overlap each other in a lamination direction, and are integrated with each other by welding and the like. Furthermore, tip portions of the terminal portions 22 of the four terminal-forming members 2 are laminated in a thickness direction, and these four tip portions are extended in mutually different directions rotationally symmetric through 90° with respect to a central axis O. Therefore, the connecting terminal 1 can bear a load applied between the connecting terminal 1 and a contact target, in a substantially isotropic manner.

Figure 5:
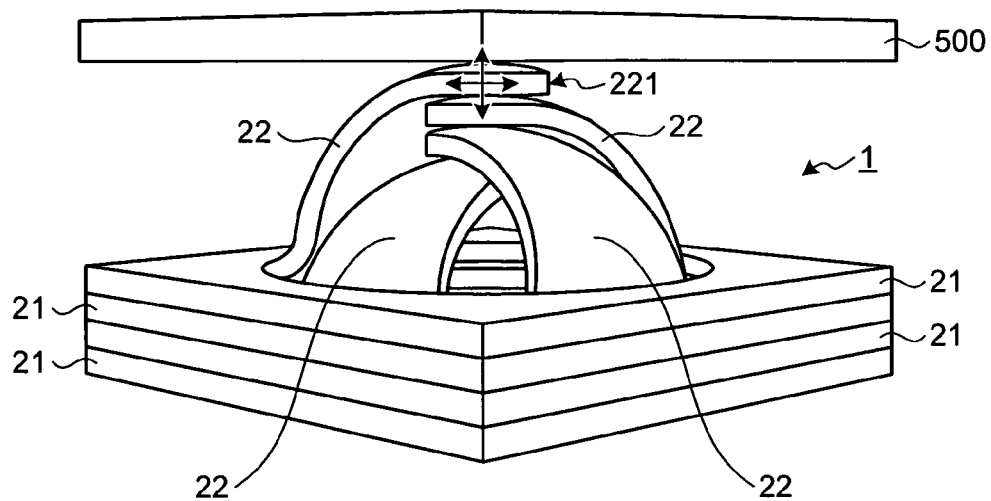
FIG. 5 is a diagram illustrating a state in which the connecting terminal according to the first embodiment of the present invention is in contact with a contacted object.

FIG. 5 is a diagram illustrating a state in which the connecting terminal 1 structured as described above is in contact with a contacted object 500 being a contact target. In FIG. 5, a tip portion 221 of the terminal portion 22 at the outermost position among the four terminal portions 22 is in direct contact with the contacted object 500. An outer surface of the tip portion 221 passes near a vertex of the sphere, and, when the outer surface comes into contact, with the contacted object 500, loads are applied in the lamination direction (vertical direction in FIG. 5) along which the tip portions of the terminal portions 22 are laminated as well as in a direction perpendicular to the lamination direction (horizontal direction in FIG. 5) as indicated by arrows of FIG. 5. Therefore, even when an oxide layer is formed on the surface of the contacted object 500, because the tip portion 221 slides on the surface to thereby scrape away the oxide layer, contact resistance to the contacted object 500 can be reduced and more reliable conduction can be ensured.

In order that the connecting terminal 1 may more reliably scrape away the oxide layer attached to the surface of the contacted object 500, it is possible to perform texturing or embossing to rough up the outer surface of the tip portion 221 of the terminal portion 22 at the outermost position, or it is possible to arrange a protrusion projecting from the outer surface.

In the first embodiment, even when a contact position is shifted because of thermal expansion by heat of the contacted object 500, the tip portion 221 of the terminal portion 22 at the outermost position among the terminal portions 22 of the terminal-forming member 2 can slide on the surface of the contacted object 500 in accordance with the position shift. Therefore, contact failure due to the heat of the contacted object 500 does not occur.

The plurality of the terminal-forming members 2 forming the connecting terminal 1 may be made of an identical material, or may be made of different materials.

For example, it is possible to apply a material having excellent slidability and solder resistance (e.g., palladium alloy, rhodium alloy, and gold alloy) to the terminal-forming member 2 to be brought into direct contact with the contacted object 500 at the outermost position, and apply a material having good springiness (e.g., phosphor bronze, stainless, copper, nickel, and nickel alloy) to the other terminal-forming members 2.

The load applied by the contact between the connecting terminal 1 and the contacted object 500 can be controlled by controlling the number of lamination of the terminal-forming members 2, and a surface area, a thickness, a shape, a material, and the like of the terminal portions 22. For example, the number of the terminal-forming members 2 to be laminated may be other than 4. Furthermore, the thickness of the terminal-forming member 2 to be in direct contact with the contacted object 500 may be made thinner than the thicknesses of the other terminal-forming members 2. Moreover, a flange extended in a width direction may be formed on the tip portions of the terminal portions 22.

Figure 6:
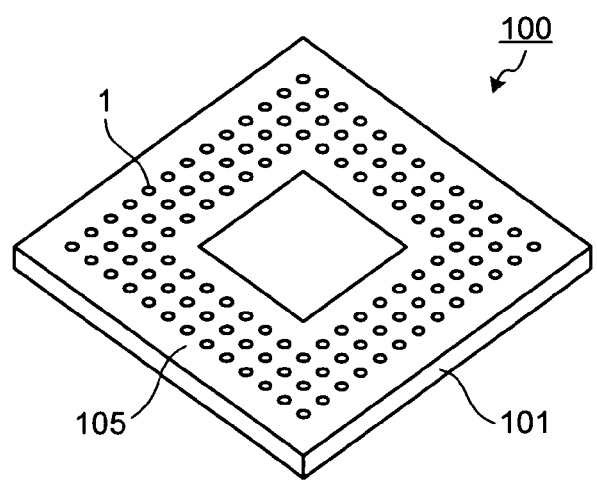
FIG. 6 is a perspective view illustrating a configuration of a semiconductor package according to the first embodiment of the present invention.
Figure 7:
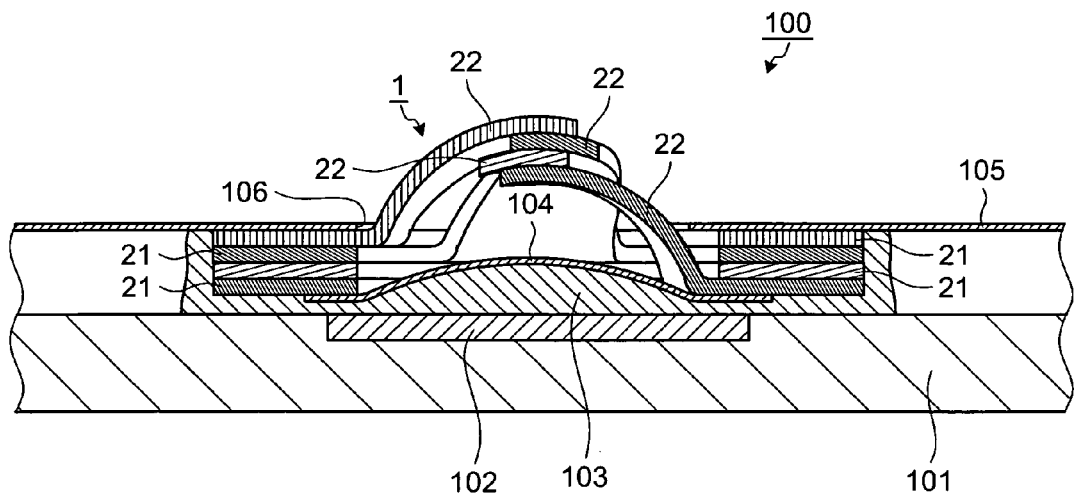
FIG. 7 is a cross sectional view illustrating an attaching form of the connecting terminal to a substrate in the semiconductor package according to the first embodiment of the present invention.

FIG. 6 is a perspective view illustrating a configuration of a semiconductor package to which the connecting terminal 1 structured as described above is applied. FIG. 7 is a cross sectional view illustrating an attaching form of the connecting terminal 1 to the semiconductor package according to the first embodiment. A semiconductor package 100 shown in FIGS. 6 and 7 includes a plurality of the connecting terminals 1 arrayed on a flat surface, a substrate 101, an electrode 102 embedded in the substrate 101, a solder 103 for bonding the connecting terminal 1 to the surface of the substrate 101 in a portion where the electrode 102 is arranged, a conductive cover member 104 interposed between the bottom surface of the connecting terminal 1 and the solder 103, and an insulating resin sheet 105 for covering the base portion 21 of the connecting terminal 1.

The solder 103 reaches the resin sheet 105 from the bottom surface of the connecting terminal 1 via the side surface of the connecting terminal 1, so that the connecting terminal 1, the substrate 101, and the resin sheet 105 are integrally bonded.

The cover member 104 is made of a conductive material, and has a function of preventing the springiness of the connecting terminal 1 from being degraded when the solder 103 is fused and the fused solder 103 reaches the edge of the opening portion 20 of each terminal portion 22 due to capillary action.

The resin sheet 105 is realized by using polyamide for example, and includes opening portions 106 for exposing the terminal portions 22 of the terminal-forming members 2 in accordance with an array pattern of the connecting terminals 1.

It is possible to interpose a spacer between the substrate 101 and the resin sheet 105 depending on the thickness of the base portion 21.

According to the first embodiment described above, because the plurality of the terminal-forming members are laminated at respective tip portions of respective terminal portions in a thickness direction, even when a position shift for the contact target occurs, the position shift can be absorbed and stable contact with the contact target can be achieved.

Figure 8:
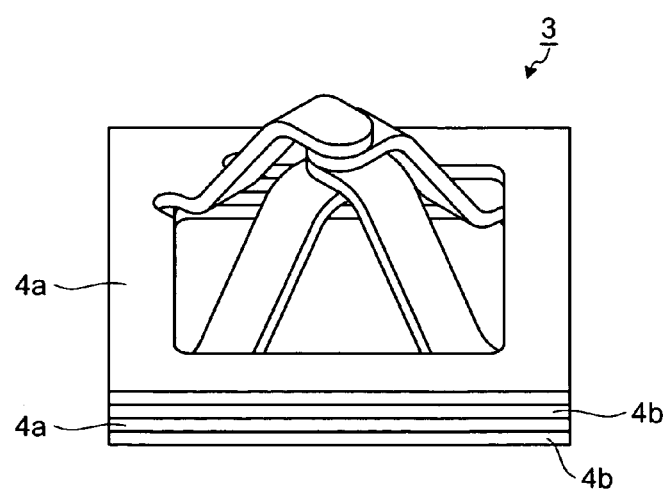
FIG. 8 is a diagram illustrating a configuration of a connecting terminal according to a first modified example of the first embodiment of the present invention.

FIG. 8 is a diagram illustrating a configuration of a connecting terminal according to a first modified example of the first embodiment. A connecting terminal 3 shown in the figure is formed such that two types of conductive terminal-forming members 4a and 4b are alternately laminated twice.

Figure 9:
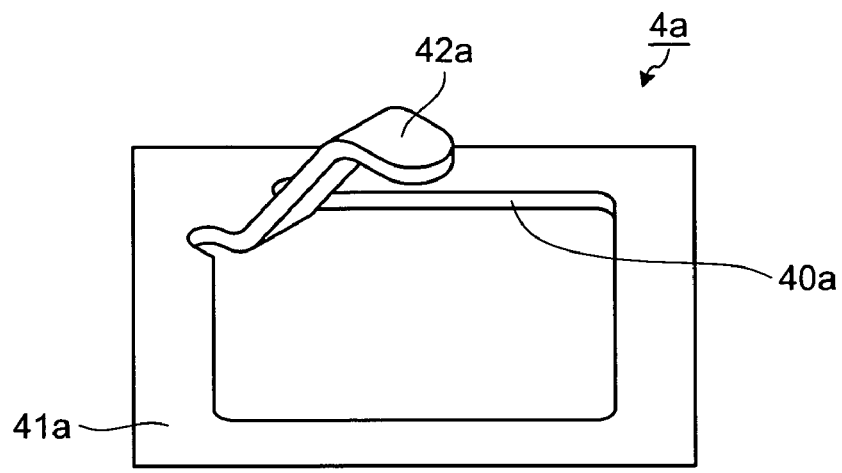
FIG. 9 is a diagram illustrating a configuration of a terminal-forming member included in the connecting terminal according to the first modified example of the first embodiment of the present invention.

FIG. 9 is a diagram illustrating a configuration of the terminal-forming member 4a. The terminal-forming member 4a shown in the figure includes a base portion 41a on which an opening portion 40a having a substantially rectangular cross section is formed, and a terminal portion 42a extended from an inner periphery being the inner periphery of the opening portion 40a near one vertex of the substantially rectangular cross section, in a direction different from the surface of the base portion 41a. The terminal portion 42a is extended obliquely upward from the base portion 41a so as to form a linear band shape, and is bent in the middle thereof. A tip portion being a bent portion is made substantially parallel to the surface of the base portion 41a. The terminal portion 42a has a substantially uniform width from the base end to the tip.

Figure 10:
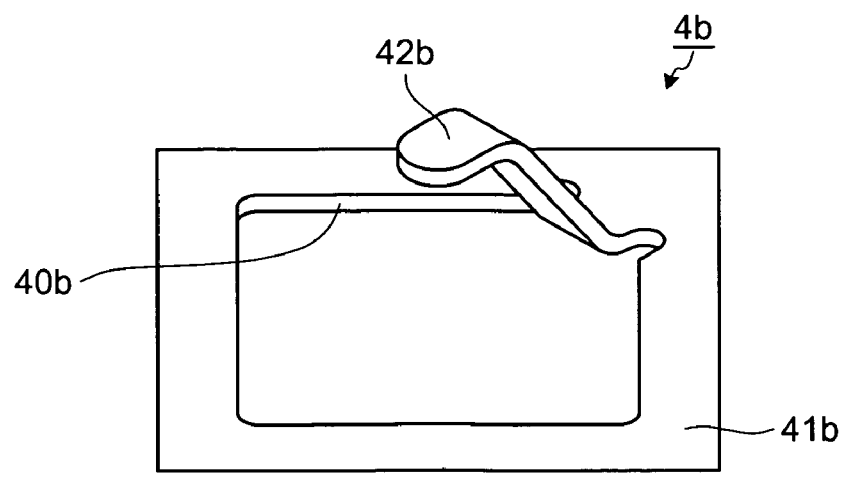
FIG. 10 is a diagram illustrating a configuration of another terminal-forming member included in the connecting terminal according to the first modified example of the first embodiment of the present invention.

FIG. 10 is a diagram illustrating a configuration of the terminal-forming member 4b. The terminal-forming member 4b shown in the figure is formed to be mirror symmetric to the terminal-forming member 4a, and includes a base portion 41b having an opening portion 40b, and a terminal portion 42b extended from the inner periphery of the opening portion 40b in a direction different from the surface of the base portion 41b.

Figure 11:
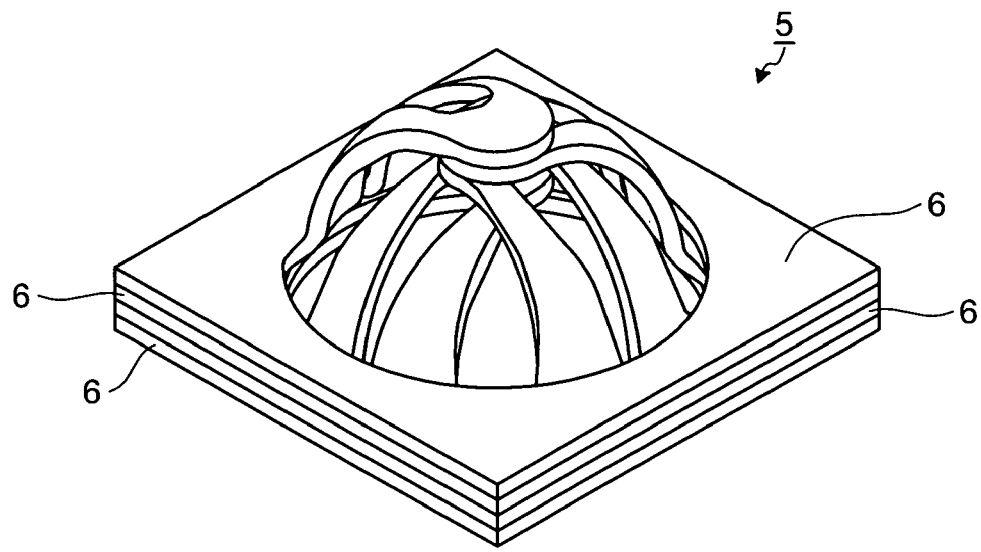
FIG. 11 is a diagram illustrating a configuration of a connecting terminal according to a second modified example of the first embodiment of the present invention.

FIG. 11 is a diagram illustrating a configuration of a connecting terminal according to a second modified example of the first embodiment. A connecting terminal 5 shown in the figure is formed such that four conducting terminal-forming members 6 are laminated.

Figure 12:
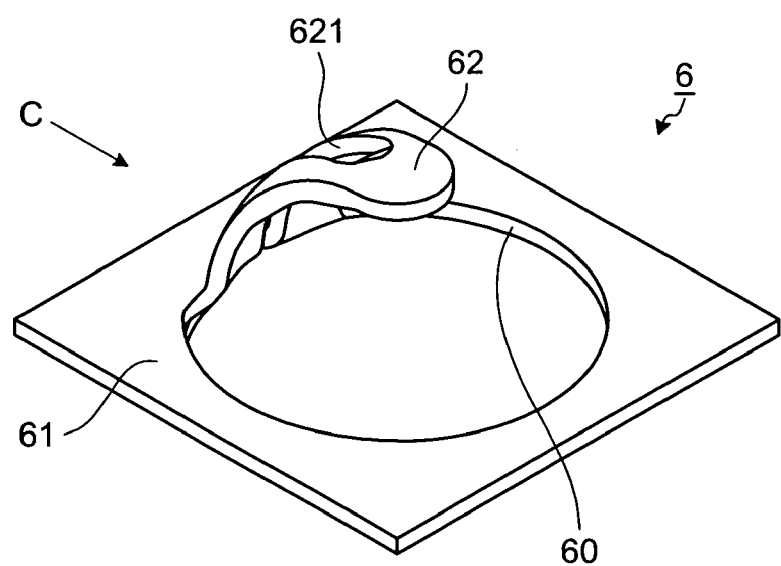
FIG. 12 is a diagram illustrating a configuration of a terminal-forming member included in the connecting terminal according to the second modified example of the first embodiment of the present invention.
Figure 13:
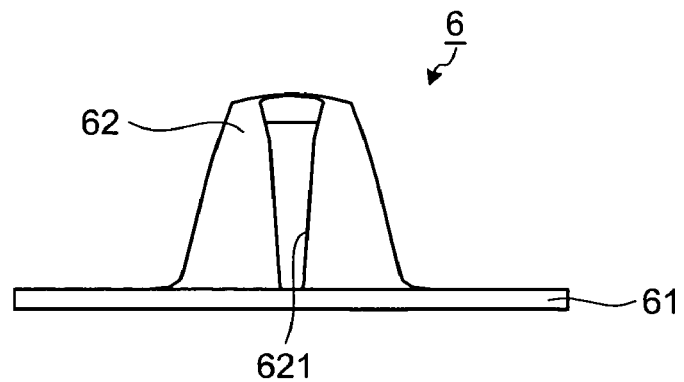
FIG. 13 is a side view taken in a direction of an arrow C of FIG. 12.

FIG. 12 is a diagram illustrating a configuration of the terminal-forming member 6. FIG. 13 is a side view taken in a direction of an arrow C of FIG. 12. The terminal-forming member 6 shown in these figures includes a base portion 61 on which an opening portion 60 having a circular cross section is formed, and a terminal portion 62 extended from the inner periphery of the opening portion 60 in a direction different from the surface of the base portion 61. In order to adjust the springiness, the terminal portion 62 has a slit 621 cut along a direction in which the terminal portion 62 is extended in the band shape. The shape and size of the slit 621 can be determined appropriately depending on the load applied between the connecting terminal 5 and the contacted object 500.

Figure 14:
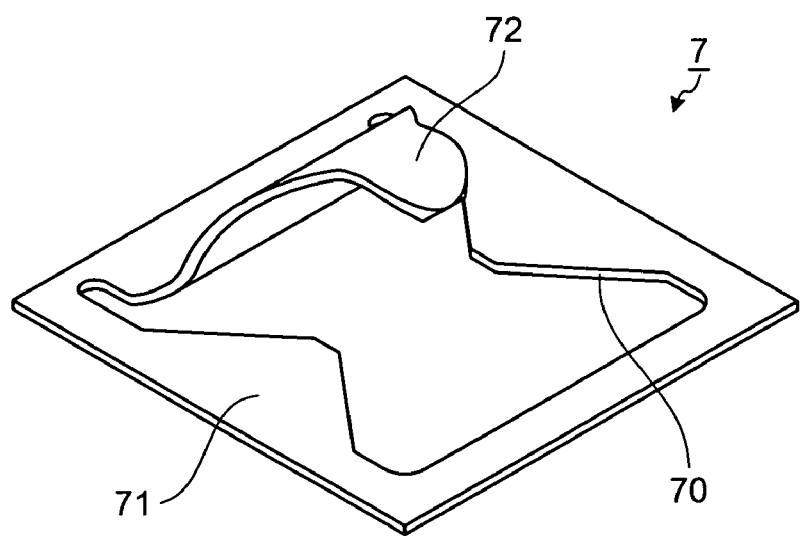
FIG. 14 is a perspective view illustrating a configuration of a terminal-forming member that forms a part of a connecting terminal according to a third modified example of the first embodiment of the present invention.

FIG. 14 is a perspective view illustrating a configuration of a terminal-forming member being a part of a connecting terminal according to a third modified example of the first embodiment. A terminal-forming member 7 shown in the figure is made of a conductive material, and includes a base portion 71 on which an opening portion 70 with a cross section in the shape of a substantial square having a pair of opposite sides constricted in the middle is formed, and a terminal portion 72 extended from an inner periphery being the inner periphery of the base portion 71 at one non-constricted side of the substantially square cross section, in a direction different from the surface of the base portion 71. In the present modified example, the connecting terminal is structured such that two terminal-forming members 7 are laminated so that respective tip portions of the terminal portions 72 are oriented in opposite directions.

According to the first to the third modified examples of the first embodiment described above, similarly to the first embodiment, the plurality of the terminal-forming members are laminated at respective tip portions of respective terminal portions in a thickness direction. Therefore, even when a position shift for the contact target occurs, the position shift can be absorbed and stable contact with the contact target can be achieved.

(Second Embodiment)

Figure 15:
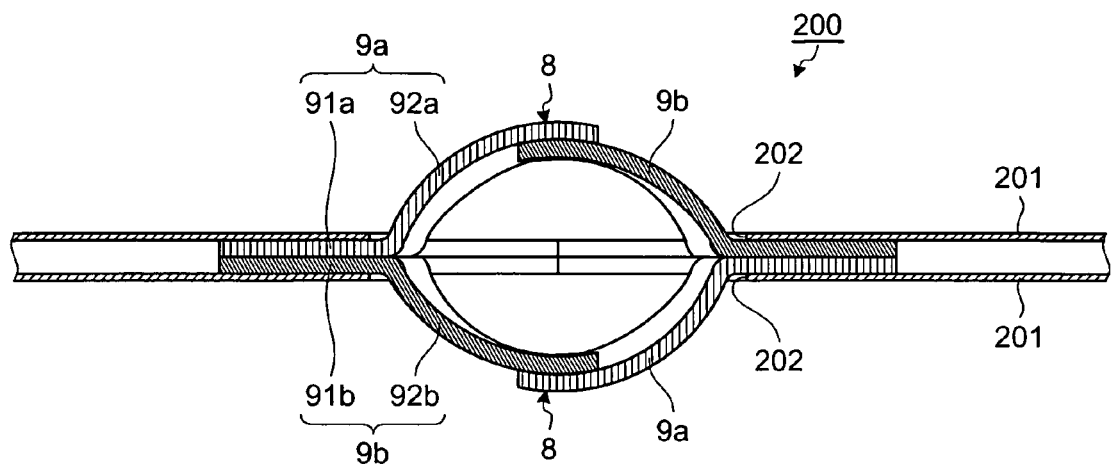
FIG. 15 is a partial cross sectional view illustrating configurations of a connecting terminal according to a second embodiment of the present invention and main components of a connector to which the connecting terminal is applied.
Figure 16:
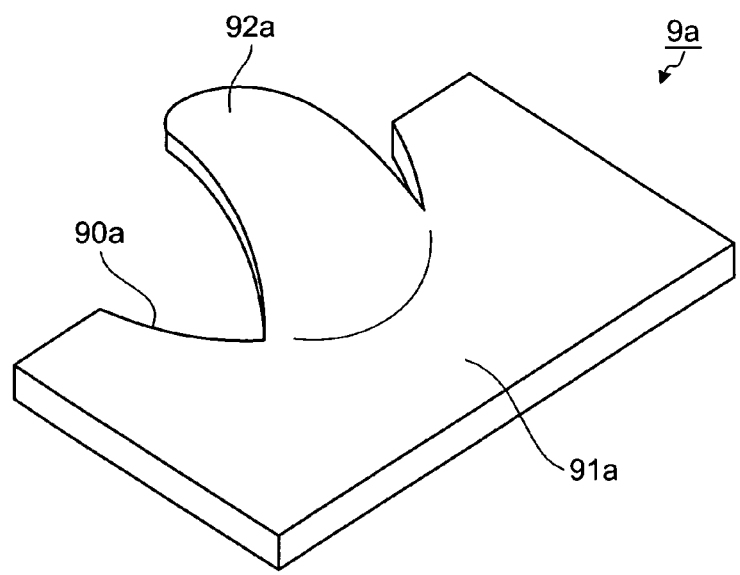
FIG. 16 is a perspective view illustrating a configuration of a terminal-forming member included in the connecting terminal according to the second embodiment of the present invention.

FIG. 15 is a partial cross sectional view illustrating configurations of a connecting terminal according to a second embodiment of the present invention and main components of a connector to which the connecting terminal is applied. A connecting terminal 8 shown in the figure is formed by laminating two conductive terminal-forming members 9a and 9b. FIG. 16 is a perspective view illustrating a configuration of the terminal-forming member 9a. The terminal-forming member 9a includes a base portion 91a having a semicircular notch 90a, and a terminal portion 92a in the form of a tapered band and is extended from the inner periphery of the notch 90a in a direction different from the surface of the base portion 91a. Each of the surfaces of the terminal portion 92a, i.e., the outer and inner surfaces forms a part of a sphere.

The terminal-forming member 9b has the substantially same shape as the terminal-forming member 9a, and includes a base portion 91b having a notch 90b, and a terminal portion 92b extended from the inner periphery of the notch 90b. A diameter of a sphere a part of which is formed of the outer surface of the terminal portion 92b is smaller than a diameter of a sphere a part of which is formed of the outer surface of the terminal portion 92a, and is substantially the same as a diameter of a sphere a part of which is formed of the inner surface of the terminal portion 92a.

Figure 17:
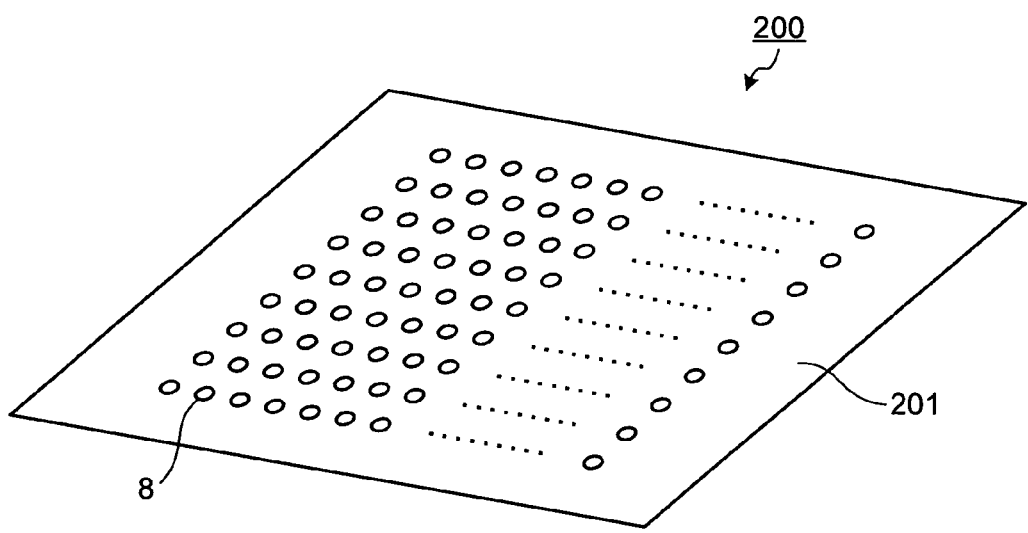
FIG. 17 is a perspective view illustrating an external configuration of the connector according to the second embodiment of the present invention.

FIG. 17 is a perspective view illustrating an overall configuration of a connector according to the second embodiment. A connector 200 shown in the figure is formed of a plurality of the connecting terminals 8 arrayed in accordance with a predetermined pattern. As shown in FIG. 15, each connecting terminal 8 is electrically connected to other connecting terminal 8 protruding in an opposite direction, and they are sandwiched by two resin sheets 201. Each resin sheet 201 has a plurality of opening portions 202 for exposing the terminal portions 92a of the terminal-forming members 9a and the terminal portions 92b of the terminal-forming members 9b in accordance with the array pattern of the connecting terminals 8.

When the connecting terminals 8 are bonded to the resin sheet 201 or the connecting terminals 8 are bonded together, appropriate adhesive may be used, or they may be screwed together by arranging screw holes piercing the base portions 91a and 91b in thickness directions.

The connector 200 structured as described above may be applied to a terminal portion of a socket to be interposed between the semiconductor package and a motherboard to establish electrical connection between them.

According to the second embodiment described above, the terminal portions included in the plurality of the terminal-forming members are laminated at respective tip portions in a thickness direction. Therefore, even when a position shift for a contact target occurs, the position shift can be absorbed and stable contact with the contact target can be achieved.

Furthermore, according to the second embodiment, when it is applied to the terminal portion of a socket, a thickness of the socket can be made thinner than those of conventional ones. Therefore, it is suitably applied to a terminal portion of a socket for electronic devices required to have small footprint, such as a notebook personal computer.

(Third Embodiment)

Figure 18:
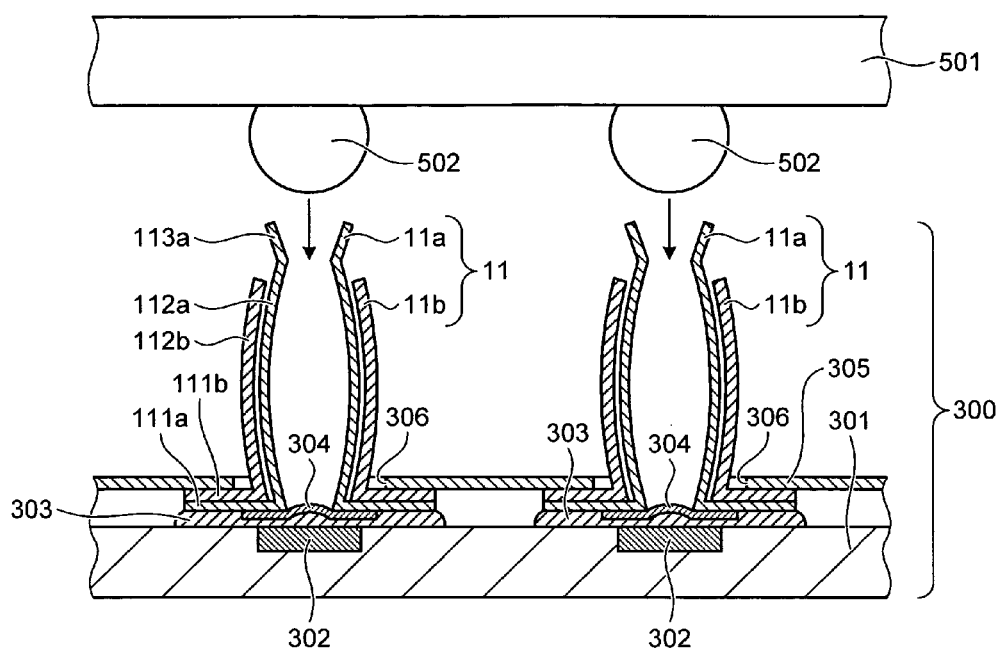
FIG. 18 is a partial cross sectional view illustrating configurations of a connecting terminal according to a third embodiment of the present invention and main components of a wiring board to which the connecting terminal is applied.

FIG. 18 is a partial cross sectional view illustrating configurations of a connecting terminal according to a third embodiment of the present invention and main components of a wiring board to which the connecting terminal is applied. A connecting terminal 11 shown in the figure includes an inner terminal-forming member 11a in the form of a band extended in a direction different from a plane passing through a base end portion, and an outer terminal-forming member 11b laminated on the outer surface of the inner terminal-forming member 11a. The inner terminal-forming member 11a and the outer terminal-forming member 11b are made of a conductive material.

The inner terminal-forming member 11a includes a base portion 111a in the form of a plate, and a terminal portion 112a extended from an edge portion of the base portion 111a in a direction different from the surface of the base portion 111a. An inner surface of a tip portion 113a of the terminal portion 112a forms a part of a substantial sphere, and is in surface contact with a spherical electrode 502 of a semiconductor package 501. The semiconductor package 501 is a BGA for example, and the electrode 502 is a solder ball. It is preferable to apply a material having excellent slidability and solder resistance to the inner terminal-forming member 11a.

The outer terminal-forming member 11b includes a base portion 111b in the form of a plate, and a terminal portion 112b extended from an edge portion of the base portion 111b in a direction different from the surface of the base portion 111b. The terminal portion 112b is assembled so as to surround an outer circumference of the base end portion of the terminal portion 112a of the inner terminal-forming member 11a. The length of the terminal portion 112b extended from a base end portion is shorter than the length of the terminal portion 112a extended from the base end portion. Therefore, the tip portion 113a of the inner terminal-forming member 11a is exposed on the outer circumference side (see FIG. 18). Furthermore, the base portion 111b is assembled so as to be laminated on the top surface of the base portion 111a. It is preferable to apply a material having good springiness to the outer terminal-forming member 11b.

Figure 19:
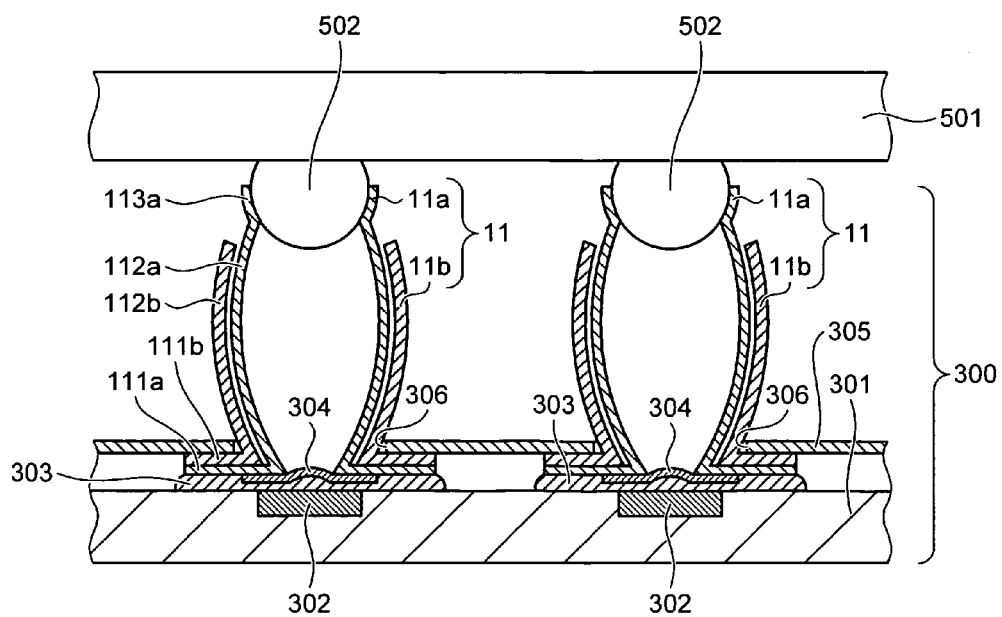
FIG. 19 is a diagram illustrating a state in which the connecting terminal according to the third embodiment of the present invention is in contact with an electrode of a semiconductor package.

FIG. 19 is a diagram illustrating a state in which the connecting terminal 11 is in contact with the electrode 502 of the semiconductor package 501. In FIG. 19, the inner terminal-forming member 11a is biased toward the center of the electrode 502 by the outer terminal-forming member 11b, so that the inner terminal-forming member 11a can reliably be in contact with the electrode 502. Furthermore, while the state shown in FIG. 18 is transited to the state shown in FIG. 19, the tip portion 113a slides on the surface of the electrode 502. Therefore, even when an oxide layer is formed on the surface of the electrode 502, the oxide layer can be scraped away. Consequently, contact resistance to the electrode 502 can be reduced and more reliable conduction can be ensured.

A wiring board 300 includes a plurality of the connecting terminals 11 arrayed in a predetermined pattern on a flat surface, a substrate 301, an electrode 302 embedded in the substrate 301, a solder 303 for bonding the bottom surface of the base portion 111a and the electrode 302 to each other, a conductive cover member 304 interposed between the bottom surface of the base portion 111a and the solder 303, and an insulating resin sheet 305 that covers the base portion 111b.

The cover member 304 is made of a conductive material, and, when the solder 303 is fused, the cover member 304 prevents the fused solder 303 from reaching the terminal portions 112a and 112b due to capillary action.

The resin sheet 305 is realized by using polyamide for example, and includes opening portions 306 for exposing the terminal portions 112a of the inner terminal-forming members 11a and the terminal portions 112b of the outer terminal-forming members 11b in accordance with an array pattern of the connecting terminals 11.

According to the third embodiment described above, in addition to the same effects as those of the first and the second embodiments described above, it is possible to establish an electrical connection to an electrode of a semiconductor package without fusing the electrode. Therefore, mounting and demounting of the semiconductor package can be made easier.

Furthermore, according to the third embodiment, it is not necessary to arrange a socket for the semiconductor package. Therefore, transmission loss by the socket can be prevented, and performance of the semiconductor package can fully be delivered. Also, the footprint downsizing can be achieved similarly to the second embodiment.

The semiconductor package being a contact target of the connecting terminal of the third embodiment is not limited to ones having a spherical electrode such as a BGA, and may be others having a pin-shaped electrode such as a PGA (Pin Grid Array).

(Fourth Embodiment)

Figure 20:
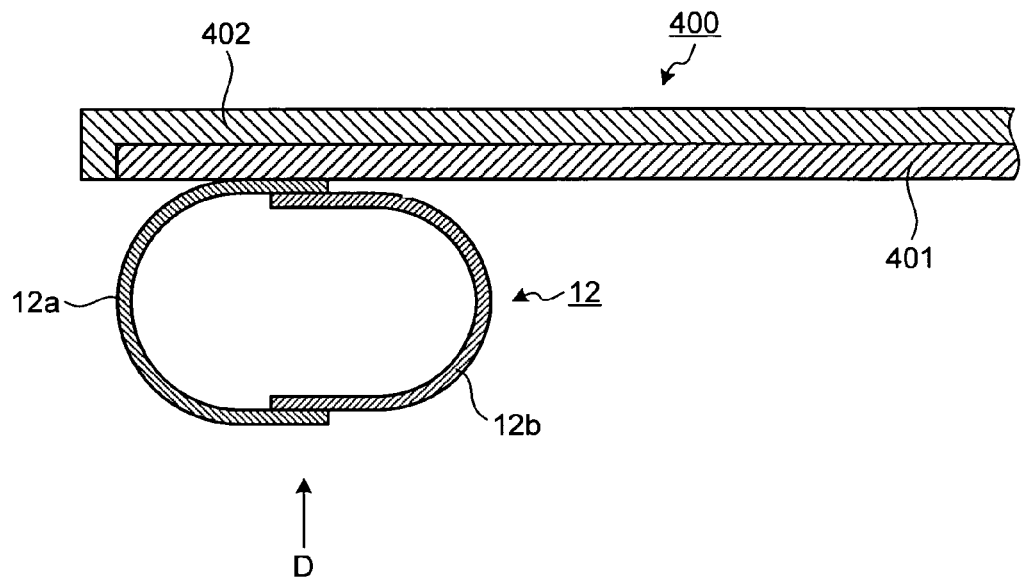
FIG. 20 is a partial cross sectional view illustrating configurations of a connecting terminal according to a fourth embodiment of the present invention and main components of a microcontactor to which the connecting terminal is applied.
Figure 21:
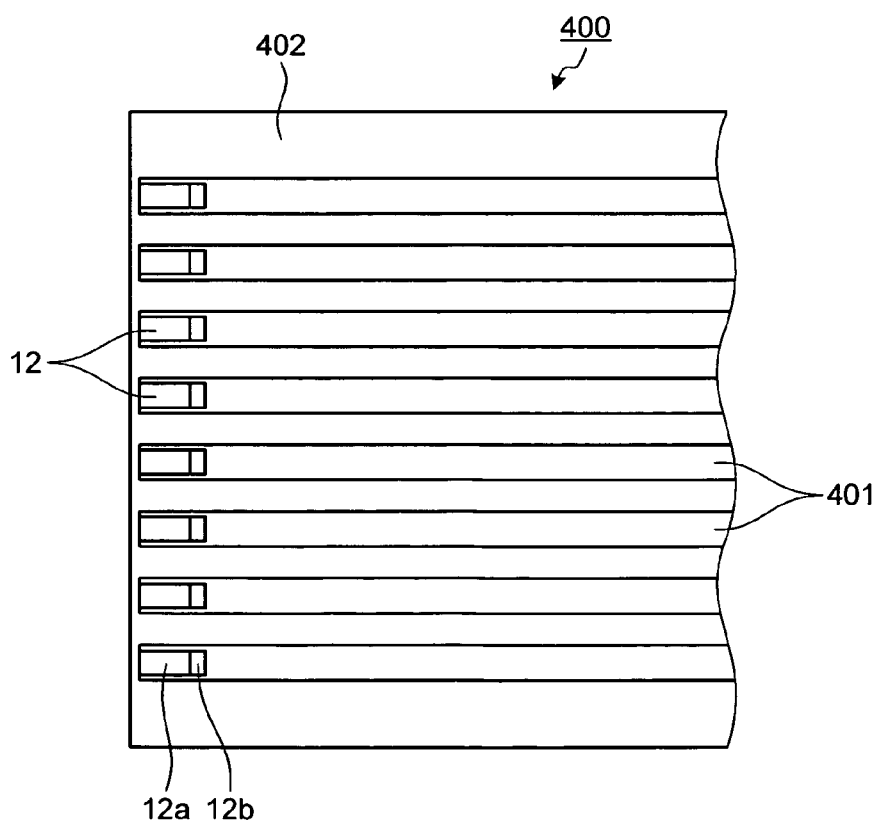
FIG. 21 is a plan view taken in a direction of an arrow D of FIG. 20.

FIG. 20 is a partial cross sectional view illustrating configurations of a connecting terminal according to a fourth embodiment of the present invention and main components of a microcontactor to which the connecting terminal is applied. FIG. 21 is a plan view taken in a direction of an arrow D of FIG. 20. A connecting terminal 12 shown in the figures includes two terminal-forming members 12a and 12b each having a band shape curved in a substantially semielliptical shape along a longitudinal direction. Both ends of the terminal-forming member 12a are laminated on respective ends of the terminal-forming member 12b in a thickness direction. Therefore, the connecting terminal 12 has a rounded and closed shape. One end between the ends where the terminal-forming members 12a and 12b are laminated is fixedly bonded by welding and the like.

A microcontactor 400 is used for testing a liquid crystal panel, an integrated circuit, and the like, and includes a plurality of connecting terminals 12 arrayed on a flat surface, a plurality of wirings 401 electrically connected to the plurality of the connecting terminals 12, respectively, and an insulating resin sheet 402 that holds the plurality of the wirings 401 parallel to one another.

The connecting terminal 12 is fixed to the wirings 401 at the end where the terminal-forming members 12a and 12b are fixedly bonded to each other. An array pattern of the connecting terminals 12 is determined depending on an array pattern of electrodes included in a test object to be in contact with the connecting terminals 12.

Among the ends of the wirings 401, ends to which the connecting terminals 12 are not fixedly bonded are electrically connected to a circuit structure for outputting a signal for a test.

Loads of the microcontactor 400 can be controlled by adjusting a length, a width, a thickness, and the like of each of the terminal-forming members 12a and 12b.

According to the fourth embodiment as described above, the terminal portions included in the plurality of the terminal-forming members are laminated at respective ends in the thickness direction. Therefore, even when a position shift for a contact target occurs, the position shift can be absorbed and stable contact with the contact target can be achieved.

Although the first to the fourth embodiments are described as the best modes for carrying out the present invention, the present invention is not limited by these embodiments. In other words, the present invention can include various embodiments and the like not described here, and various design changes and the like can be made in the range without departing from the technical idea as specified by the claims.

Industrial Applicability

As described above, the connecting terminal, the semiconductor package, the wiring board, the connector, and the microcontactor according to the present invention are useful as a technology for realizing a stable contact with a contact target.

The invention claimed is:

1. A connecting terminal to be in contact with a contact target for establishing an electrical connection to the contact target, the connecting terminal comprising:
a plurality of conductive terminal-forming members each having a terminal portion, which is extended in a band shape and at least a portion of a surface of which forms a curved surface, wherein
each terminal portion and at least one of other terminal portions are partly laminated on each other in a thickness direction, and
each terminal portion is extended in a different direction from those of the other terminal portions, wherein tip portions of each extended terminal portion are laminated one on top of another.

2. The connecting terminal according to claim 1, wherein tip portions of all the terminal portions are laminated one on top of the other in the thickness direction.

3. The connecting terminal according to claim 2, wherein the terminal-forming member having the terminal portion to be in direct contact with the contact target is made of a material different from a material of the other terminal-forming members.

4. The connecting terminal according to claim 1, wherein each terminal portion has a slit cut along a direction in which the terminal portion is extended in the band shape.

5. The connecting terminal according to claim 1, wherein each terminal portion has a slit cut along a direction in which the terminal portion is extended in the band shape.

6. The connecting terminal according to claim 1, wherein the plurality of terminal-forming members has identical shapes.

7. The connecting terminal according to claim 6, wherein each terminal portion has a slit cut along a direction in which the terminal portion is extended in the band shape.

8. The connecting terminal according to claim 6, wherein each terminal portion is extended in a different direction from those of the other terminal portions.

9. The connecting terminal according to claim 8, wherein each terminal portion has a slit cut along a direction in which the terminal portion is extended in the band shape.

10. The connecting terminal according to claim 1, wherein each terminal-forming member includes a base portion that
is in a form of a plate and that has an opening portion piercing therethrough in a thickness direction, and
each terminal portion is extended in the band shape from an inner periphery of the opening portion.

11. The connecting terminal according to claim 10, wherein each terminal portion has a slit cut along a direction in which the terminal portion is extended in the band shape.

12. The connecting terminal according to claim 10, wherein each terminal portion is extended in a different direction from those of the other terminal portions.

13. The connecting terminal according to claim 12, wherein each terminal portion has a slit cut along a direction in which the terminal portion is extended in the band shape.

14. The connecting terminal according to claim 10, wherein the plurality of terminal-forming members has identical shapes.

15. The connecting terminal according to claim 14, wherein each terminal portion has a slit cut along a direction in which the terminal portion is extended in the band shape.

16. The connecting terminal according to claim 14, wherein each terminal portion is extended in a different direction from those of the other terminal portions.

17. The connecting terminal according to claim 16, wherein each terminal portion has a slit cut along a direction in which the terminal portion is extended in the band shape.

18. The connecting terminal according to claim 1, wherein each of the plurality of terminal-forming members includes
an inner terminal-forming member formed such that an inner surface of a tip portion of each terminal portion forms a part of a substantial sphere; and
an outer terminal-forming member laminated on an outer circumferential side of the inner terminal-forming member.

19. The connecting terminal according to claim 18, wherein
the inner terminal-forming member is made of a material different from a material of the outer terminal-forming member.

20. The connecting terminal according to claim 18, wherein each terminal portion has a slit cut along a direction in which the terminal portion is extended in the band shape.

21. The connecting terminal according to claim 1, wherein the surface forms approximately half of a sphere.

22. The connecting terminal according to claim 1, wherein the surface substantially forms a sphere.

23. A semiconductor package comprising a plurality of connecting terminals to be in contact with a contact target for establishing an electrical connection to the contact target, each connecting terminal comprising a plurality of conductive terminal-forming members each having a terminal portion, which is extended in a band shape and at least a portion of a surface of which forms a curved surface, wherein
each terminal portion and at least one of other terminal portions are partly laminated on each other in a thickness direction,
each terminal portion is extended in a different direction from those of the other terminal portions, wherein tip portions of each extended terminal portion are laminated one on top of another, and
the connecting terminals are arranged on a flat surface.

* * * * *